United States Patent
Lin et al.

(10) Patent No.: US 10,892,026 B2
(45) Date of Patent: Jan. 12, 2021

(54) MEMORY MANAGEMENT METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); An-Cheng Liu, Taipei (TW); Szu-Wei Chen, New Taipei (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 55 days.

(21) Appl. No.: 16/003,114

(22) Filed: Jun. 8, 2018

(65) Prior Publication Data

US 2019/0318791 A1   Oct. 17, 2019

(30) Foreign Application Priority Data

Apr. 16, 2018 (TW) .............................. 107112940 A

(51) Int. Cl.
| | | |
|---|---|---|
| G11C 16/34 | (2006.01) | |
| G11C 16/10 | (2006.01) | |
| G11C 16/26 | (2006.01) | |
| G06F 3/06 | (2006.01) | |
| G11C 11/56 | (2006.01) | |
| G11C 16/04 | (2006.01) | |

(52) U.S. Cl.
CPC .......... *G11C 16/349* (2013.01); *G06F 3/0604* (2013.01); *G06F 3/0655* (2013.01); *G06F 3/0679* (2013.01); *G11C 16/10* (2013.01); *G11C 16/26* (2013.01); *G11C 11/5671* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 9,666,292 B2* | 5/2017 | Kim ..................... | G11C 16/26 |
| 2008/0158948 A1* | 7/2008 | Sharon ................ | G06F 11/1072 |
| | | | 365/185.02 |
| 2008/0263265 A1* | 10/2008 | Litsyn ................ | G11C 11/5642 |
| | | | 711/103 |

* cited by examiner

*Primary Examiner* — Charles J Choi
(74) *Attorney, Agent, or Firm* — JCIPRNET

(57) ABSTRACT

A memory management method for a memory storage device including a rewritable non-volatile memory module is provided according to an exemplary embodiment of the disclosure. The method includes: programming first data into a plurality of first memory cells in the rewritable non-volatile memory module, such that the programmed first memory cells have a plurality of states; sending a first single-stage read command sequence which indicates to read the programmed first memory cells by using a first read voltage level; obtaining first count information corresponding to the first read voltage level according to a read result corresponding to the first single-stage read command sequence; and adjusting the first read voltage level according to the first count information and default count information corresponding to the first read voltage level.

23 Claims, 8 Drawing Sheets

MEMORY MANAGEMENT METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 107112940, filed on Apr. 16, 2018. The entirety of the above-mentioned patent application is hereby incorporated by reference herein and made a part of this specification.

BACKGROUND

Technical Field

The disclosure relates to a memory management mechanism, and in particular, to a memory management method, a memory storage device, and a memory control circuit unit.

Description of Related Art

As digital cameras, mobile phones, and MP3 players have been growing rapidly in recent years, consumers' demand for storage media has also been growing significantly. With characteristics including data non-volatility, energy saving, small size, lack of mechanical structures, etc., rewritable non-volatile memory modules (e.g., flash memories) are ideal to be built in various portable multi-media devices such as those listed above.

In a memory storage device capable of storing multiple bits in one memory cell, a plurality of default read voltage levels are used to read data stored in memory cells belonging to different states. However, after the memory storage device is used for a period of time, with wearing of the memory cells, the default read voltage levels may be significantly shifted with respect to the threshold voltage distribution of the memory cells, and may be further shifted to be mistakenly identified as read voltage levels configured to read the neighboring states. In that case, the shifted read voltage levels may not be accurately corrected by using conventional read voltage adjustment mechanisms, which results in a decrease in a lifespan of the memory storage device.

Nothing herein should be construed as an admission of knowledge in the prior art of any portion of the disclosure. Furthermore, citation or identification of any document in this application is not an admission that such document is available as prior art to the disclosure, or that any reference forms a part of the common general knowledge in the art.

SUMMARY

The embodiments of the disclosure provide a memory management method, a memory storage device, and a memory control circuit unit that enhance correction efficiency of read voltage levels.

An exemplary embodiment of the disclosure provides a memory management method for a memory storage device including a rewritable non-volatile memory module. The rewritable non-volatile memory module includes a plurality of memory cells, and the memory management method includes the following steps. First data is programmed into a plurality of first memory cells among the memory cells, such that the programmed first memory cells have a plurality of states, and each of the states corresponds to a default bit value. A first single-stage read command sequence which indicates to read the programmed first memory cells by using a first read voltage level is sent. First count information corresponding to the first read voltage level is obtained according to a read result corresponding to the first single-stage read command sequence. The first read voltage level is adjusted according to the first count information and default count information corresponding to the first read voltage level.

Another exemplary embodiment of the disclosure provides a memory storage device including a connection interface unit, a rewritable non-volatile memory module, and a memory control circuit unit. The connection interface unit is configured to couple to a host system. The rewritable non-volatile memory module includes a plurality of memory cells. The memory control circuit unit is coupled to the connection interface unit and the rewritable non-volatile memory module. The memory control circuit unit is configured to send a write command sequence which indicates to program first data into a plurality of first memory cells among the memory cells, such that the programmed first memory cells have a plurality of states, and each of the states corresponds to a default bit value. The memory control circuit unit is further configured to send a first single-stage read command sequence which indicates to read the programmed first memory cells by using a first read voltage level. The memory control circuit unit is further configured to obtain first count information corresponding to the first read voltage level according to a read result corresponding to the first single-stage read command sequence. The memory control circuit unit is further configured to adjust the first read voltage level according to the first count information and default count information corresponding to the first read voltage level.

Another exemplary embodiment of the disclosure provides a memory control circuit unit configured to control a rewritable non-volatile memory module including a plurality of memory cells. The memory control circuit unit includes a host interface, a memory interface, and a memory management circuit. The host interface is configured to couple to a host system. The memory interface is configured to couple to the rewritable non-volatile memory module. The memory management circuit is coupled to the host interface and the memory interface. The memory management circuit is configured to send a write command sequence which indicates to program first data into a plurality of first memory cells among the memory cells, such that the programmed first memory cells have a plurality of states, and each of the states corresponds to a default bit value. The memory management circuit is further configured to send a first single-stage read command sequence which indicates to read the programmed first memory cells by using a first read voltage level. The memory management circuit is further configured to obtain first count information corresponding to the first read voltage level according to a read result corresponding to the first single-stage read command sequence. The memory management circuit is further configured to adjust the first read voltage level according to the first count information and default count information corresponding to the first read voltage level.

Another exemplary embodiment of the disclosure provides a memory management method for a memory storage device including a rewritable non-volatile memory module. The rewritable non-volatile memory module includes a plurality of memory cells, and the memory management method includes the following steps. In a first read mode, a first single-stage read command sequence which indicates to read a plurality of first memory cells being programmed among the memory cells by using a first read voltage level is sent, wherein response information of the first single-stage read command sequence contains first count information for adjusting the first read voltage level. In the first read mode, a first common read command sequence which indicates to read the first memory cells by using the adjusted first read voltage level is sent, wherein response information of the first common read command sequence is used to generate read data requested by a host system.

Accordingly, after the first data is programmed into the first memory cells, the first memory cells have a plurality of states. After the first memory cells are read by using the first read voltage level, the first count information corresponding to the first read voltage level is obtained according to the read result corresponding to the first single-stage read command sequence. Next, the first read voltage level is automatically adjusted according to the first count information and the default count information corresponding to the first read voltage level. Thereby, even if a threshold voltage distribution of the memory cells is significantly shifted, the read voltage level configured to read data from the memory cells can be effectively corrected, which further extends a lifespan of the memory storage device.

To provide a further understanding of the aforementioned and other features and advantages of the disclosure, exemplary embodiments, together with the reference drawings, are described in detail below.

It should be understood, however, that this Summary may not contain all of the aspects and embodiments of the disclosure and is not meant to be limiting or restrictive in any manner, and that the disclosure as disclosed herein is and will be understood by those of ordinary skill in the art to encompass obvious improvements and modifications thereto.

DESCRIPTION OF THE EMBODIMENTS

Figure 1:
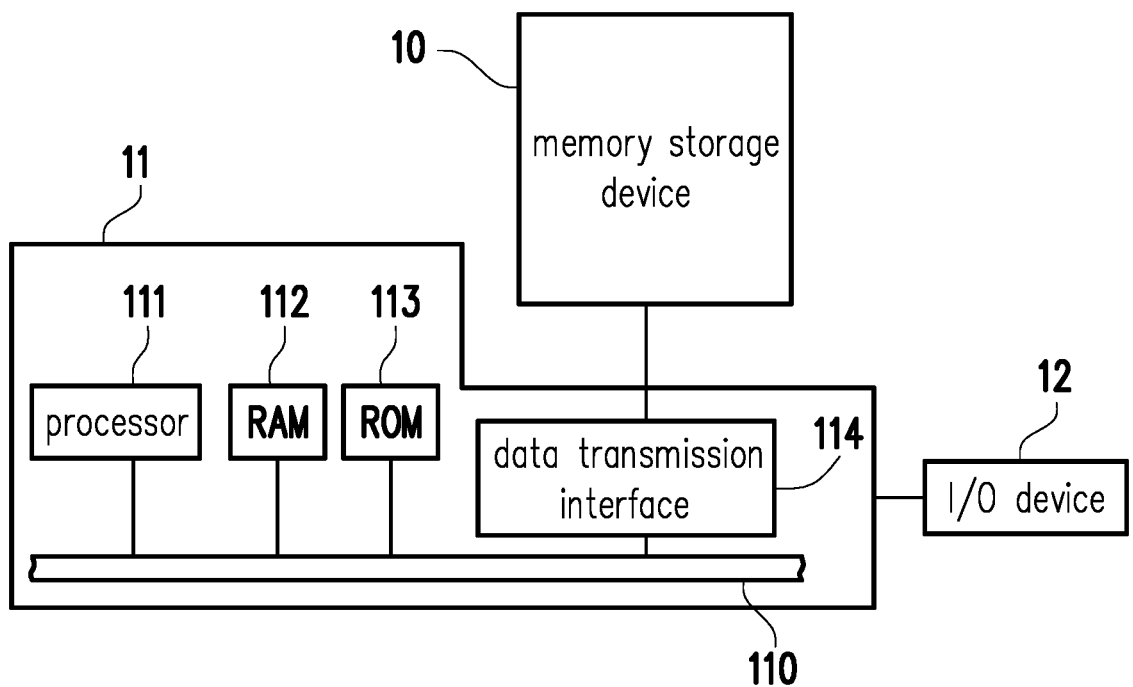
FIG. 1 is a schematic diagram illustrating a host system, a memory storage device, and an input/output (I/O) device according to an exemplary embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the Description of the Embodiments, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also referred to as a memory storage system) includes a rewritable non-volatile memory module and a controller (also referred to as a control circuit). The memory storage device is usually used together with a host system, such that the host system can write data to the memory storage device or read data from the memory storage device.

Figure 2:
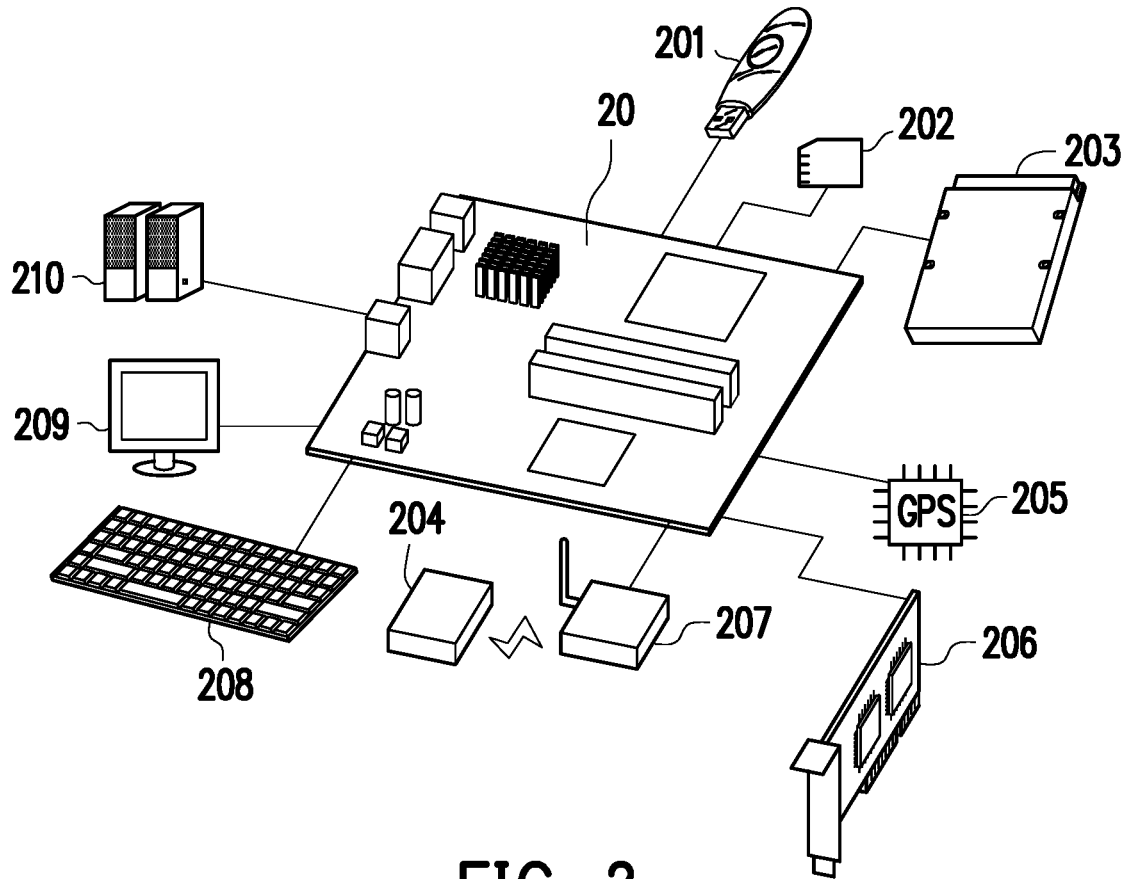
FIG. 2 is a schematic diagram illustrating a host system, a memory storage device, and an I/O device according to another exemplary embodiment of the disclosure.

FIG. 1 is a schematic diagram illustrating a host system, a memory storage device, and an input/output (I/O) device according to an exemplary embodiment of the disclosure. FIG. 2 is a schematic diagram illustrating a host system, a memory storage device, and an I/O device according to another exemplary embodiment of the disclosure.

Referring to FIG. 1 and FIG. 2, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the present exemplary embodiment, the host system 11 is coupled to a memory storage device 10 via the data transmission interface 114. For example, the host system 11 may store data to the memory storage device 10 or read data from the memory storage device 10 via the data transmission interface 114. Moreover, the host system 11 is coupled to the I/O device 12 via the system bus 110. For example, the host system 11 may transmit output signals to the I/O device 12 or receive input signals from the I/O device 12 via the system bus 110.

In the present exemplary embodiment, the processor 111, the random access memory 112, the read only memory 113, and the data transmission interface 114 may be installed on a motherboard 20 of the host system 11. The number of the data transmission interface 114 may be one or more. The motherboard 20 may be coupled to the memory storage device 10 via the data transmission interface 114 in wired or wireless manners. The memory storage device 10 is, for example, a flash drive 201, a memory card 202, a solid state drive (SSD) 203, or a wireless memory storage device 204. The wireless memory storage device 204 is, for example, a memory storage device based on various wireless communication technologies, such as a near field communication (NFC) memory storage device, a WiFi memory storage device, a Bluetooth memory storage device, and a Bluetooth low energy (BLE) memory storage device (e.g., iBeacon). Moreover, the motherboard 20 may also be coupled via the system bus 110 to various I/O devices, such as a global positioning system (GPS) module 205, a network interface card 206, a wireless transmission device 207, a keyboard 208, a display 209, and a speaker 210. For example, in an exemplary embodiment, the motherboard 20 may access the wireless memory storage device 204 via the wireless transmission device 207.

Figure 3:
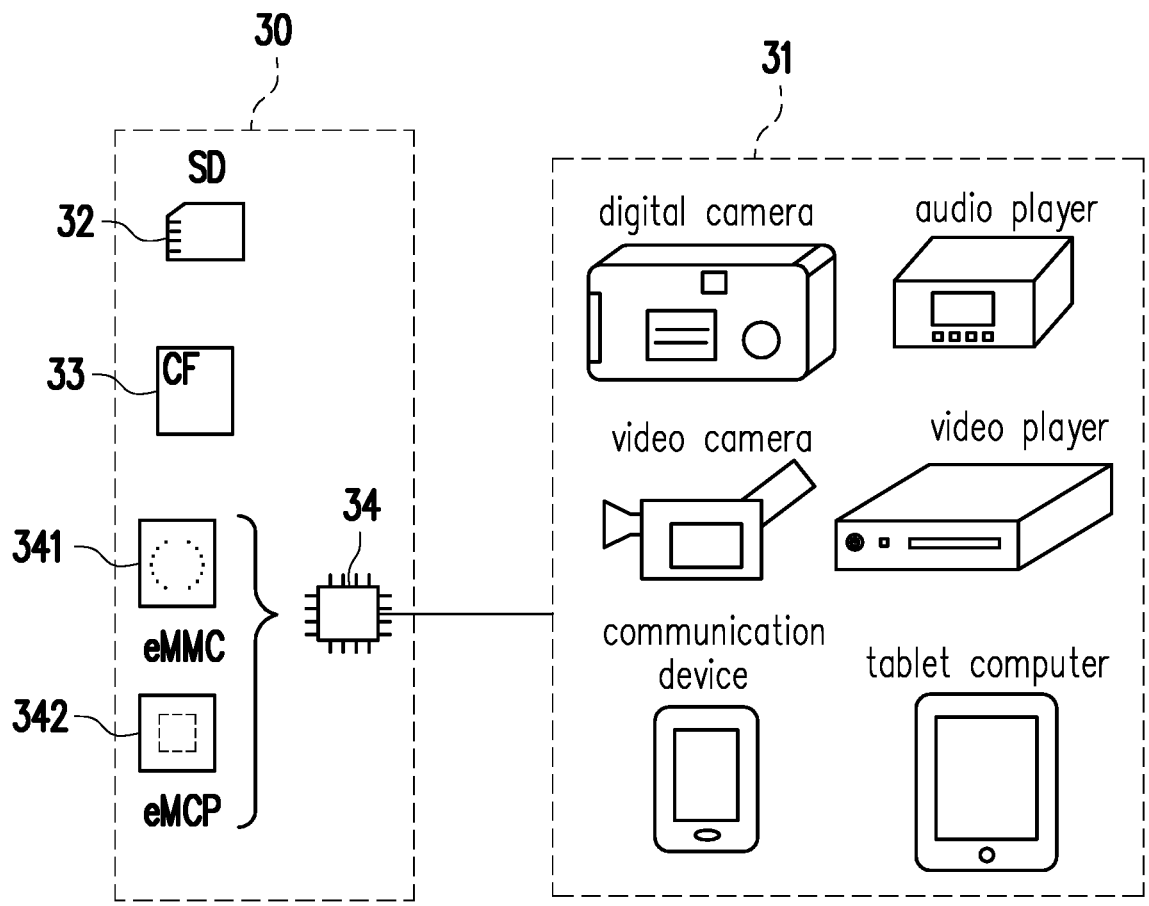
FIG. 3 is a schematic diagram illustrating a host system and a memory storage device according to another exemplary embodiment of the disclosure.

In an exemplary embodiment, the foregoing host system is any system that substantially works with the memory storage device to store data. In the exemplary embodiment above, the host system is illustrated with a computer system. However, FIG. 3 is a schematic diagram illustrating a host system and a memory storage device according to another exemplary embodiment of the disclosure. Referring to FIG. 3, in another exemplary embodiment, a host system 31 may also be a system such as a digital camera, a video camera, a communication device, an audio player, a video player, a tablet computer, etc. A memory storage device 30 may be any one of various types of non-volatile memory storage devices used by the host system 31, such as a secure digital (SD) card 32, a compact flash (CF) card 33, an embedded storage device 34, etc. The embedded storage device 34 is any of various types of embedded storage devices directly coupling a memory module to a substrate of the host system, such as an embedded multi media card (eMMC) 341 and/or an embedded multi chip package (eMCP) storage device 342.

Figure 4:
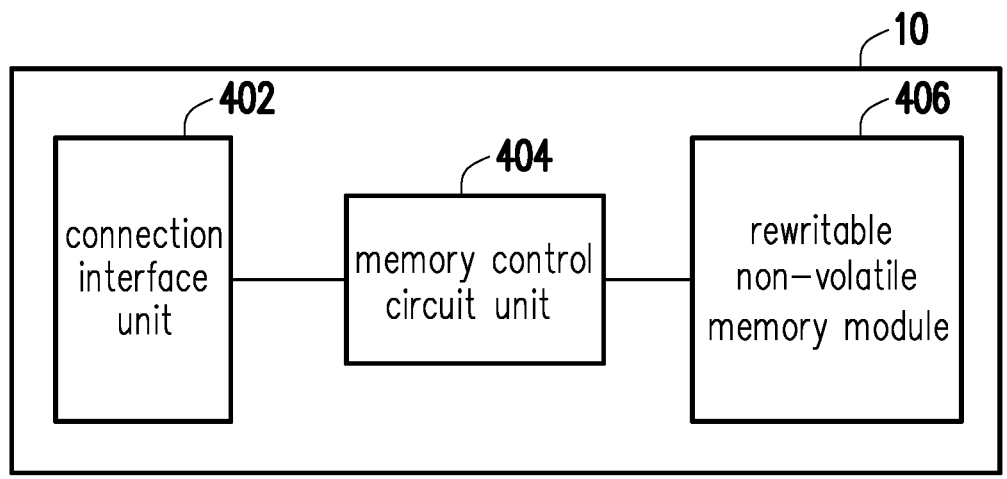
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. In the present exemplary embodiment, the connection interface unit 402 is compatible with the Serial Advanced Technology Attachment (SATA) standard. However, it is understood that the disclosure is not limited hereto. The connection interface unit 402 may also be compatible with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the SD interface standard, the Ultra High Speed-I (UHS-I) interface standard, the Ultra High Speed-II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 402 may be packaged with the memory control circuit unit 404 in one single chip, or the connection interface unit 402 may be disposed outside a chip including the memory control circuit unit 404.

The memory control circuit unit 404 is configured to execute a plurality of logic gates or control commands implemented in a hardware form or a firmware form and perform operations, such as data writing, reading, erasing, etc., in the rewritable non-volatile memory module 406, according to commands of the host system 11.

The rewritable non-volatile memory module 406 is coupled to the memory control circuit unit 404 and is configured to store data written by the host system 11. The rewritable non-volatile memory module 406 may be a multi level cell (MLC) NAND flash memory module (i.e., a flash memory module capable of storing 2 bits in one memory cell), a triple level cell (TLC) NAND flash memory module (i.e., a flash memory module capable of storing 3 bits in one memory cell), a single level cell (SLC) NAND flash memory module (i.e., a flash memory module capable of storing 1 bit in one memory cell), another flash memory module, or any other memory modules with the same characteristics.

In the rewritable non-volatile memory module 406, one or more bits are stored by changing a voltage (hereinafter also referred to as a threshold voltage) of each of the memory cells. More specifically, in each of the memory cells, a charge trapping layer is provided between a control gate and a channel. An amount of electrons in the charge trapping layer may be changed by applying a write voltage to the control gate, thereby changing the threshold voltage of the memory cell. This operation of changing the threshold voltage of the memory cell is also known as "writing data to the memory cell" or "programming the memory cell". As the threshold voltage changes, the memory cells in the rewritable non-volatile memory module 406 have a plurality of storage states. The storage state to which a memory cell belongs may be determined by applying a read voltage, thereby obtaining the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store two bits or more, the physical programming units on the same word line can be at least classified into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimal unit for programming. In other words, the physical programming unit is the minimal unit for writing data. For example, the physical programming unit is a physical page or a physical sector. When the physical programming unit is the physical page, the physical programming unit usually includes a data bit area and a redundancy bit area. The data bit area includes a plurality of physical sectors for storing user data, and the redundancy bit area is configured to store system data (e.g., management data such as an error correcting code). In the present exemplary embodiment, the data bit area includes 32 physical sectors, and a size of each physical sector is 512 bytes (B). However, in other exemplary embodiments, the data bit area may also include 8 or 16 physical sectors or physical sectors of a greater or smaller number, and the size of each physical sector may also be greater or smaller. On the other hand, the physical erasing unit is the minimal unit for erasing. Namely, each physical erasing unit contains the least number of memory cells to be erased altogether. For example, the physical erasing unit is a physical block.

Figure 5:
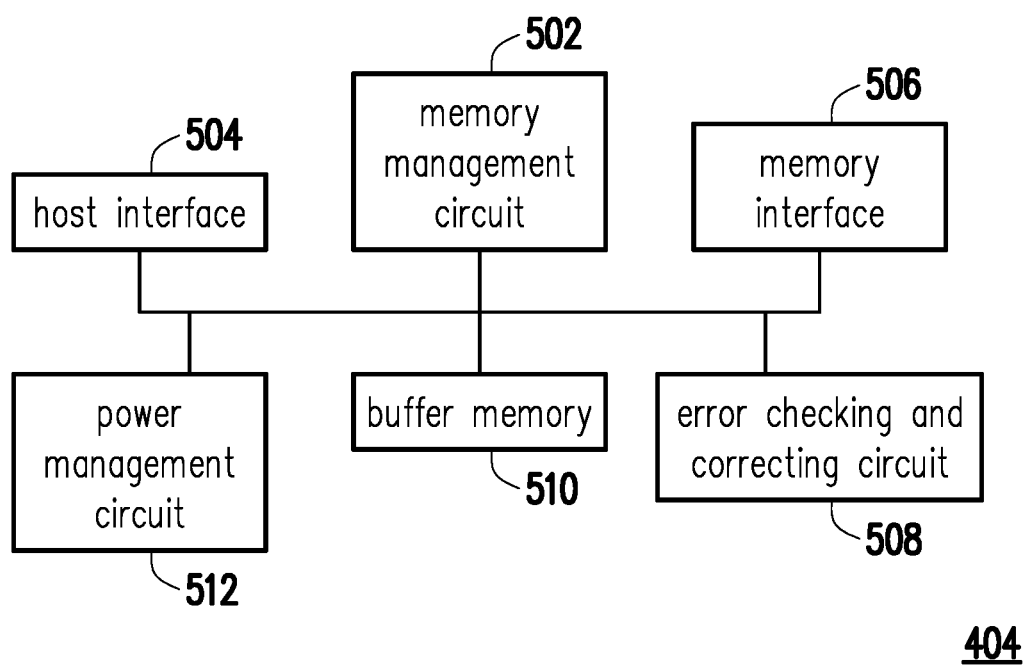
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504, and a memory interface 506.

The memory management circuit 502 is configured to control overall operations of the memory control circuit unit 404. Specifically, the memory management circuit 502 has a plurality of control commands, and when the memory storage device 10 is operated, the control commands are executed to perform operations of data writing, reading, erasing, etc. Hereinafter, the description of operations of the memory management circuit 502 is regarded as equivalent to describing operations of the memory control circuit unit 404.

In the present exemplary embodiment, the control commands of the memory management circuit 502 are implemented in a firmware form. For example, the memory management circuit 502 includes a microprocessor unit (not illustrated) and a read only memory (not illustrated), wherein the control commands are burnt into the read only memory. When the memory storage device 10 is operated, the control commands are executed by the microprocessor unit to perform operations of data writing, reading, erasing, etc.

In another exemplary embodiment, the control commands of the memory management circuit 502 may also be stored as program codes in a specific area (for example, a system area in a memory module exclusively used for storing system data) of the rewritable non-volatile memory module 406. In addition, the memory management circuit 502 includes a microprocessor unit (not illustrated), a read only memory (not illustrated), and a random access memory (not illustrated). More particularly, the read only memory has a boot code, which is executed by the microprocessor unit to load the control commands stored in the rewritable non-volatile memory module 406 to the random access memory of the memory management circuit 502 when the memory control circuit unit 404 is enabled. Afterwards, the control commands are run by the microprocessor unit to perform operations of data writing, reading, erasing, etc.

Furthermore, in another exemplary embodiment, the control commands of the memory management circuit 502 may also be implemented in a hardware form. For example, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the memory cells of the rewritable non-volatile memory module 406 or a group thereof. The memory writing circuit is configured to issue a write command sequence to the rewritable non-volatile memory module 406 to write data to the rewritable non-volatile memory module 406. The memory reading circuit is configured to issue a read command sequence to the rewritable non-volatile memory module 406 to read data from the rewritable non-volatile memory module 406. The memory erasing circuit is configured to issue an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence, and the erase command sequence each include one or more program codes or command codes and are configured to instruct the rewritable non-volatile memory module 406 to perform the corresponding operations, such as data writing, reading, and erasing. In an exemplary embodiment, the memory management circuit 502 may further issue command sequences of other types to the rewritable non-volatile memory module 406 to instruct performing corresponding operations.

The host interface 504 is coupled to the memory management circuit 502 and is configured to receive and identify commands and data transmitted by the host system 11. In other words, the commands and the data transmitted by the host system 11 are transmitted to the memory management circuit 502 via the host interface 504. In the present exemplary embodiment, the host interface 504 is compatible with the SATA standard. However, it is understood that the disclosure is not limited hereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and is configured to access the rewritable non-volatile memory module 406. In other words, data to be written to the rewritable non-volatile memory module 406 is converted into a format acceptable by the rewritable non-volatile memory module 406 through the memory interface 506. Specifically, if the memory management circuit 502 is to access the rewritable non-volatile memory module 406, the memory interface 506 transmits corresponding command sequences. For example, the command sequences may include the write command sequence for instructing writing data, the read command sequence for instructing reading data, the erase command sequence for instructing erasing data, and other corresponding command sequences for instructing performing various memory operations (e.g., changing a read voltage level or performing a garbage collection operation). These command sequences are generated by the memory management circuit 502 and are transmitted to the rewritable non-volatile memory module 406 via the memory interface 506, for example. The command sequences may include one or more signals, or data transmitted on the bus. The signals or the data may include command codes or program codes. For example, in a read command sequence, information such as identification codes and memory addresses is included.

In an exemplary embodiment, the memory control circuit unit 404 further includes an error checking and correcting circuit 508, a buffer memory 510, and a power management circuit 512.

The error checking and correcting circuit 508 is coupled to the memory management circuit 502 and is configured to perform an error checking and correcting operation to ensure the correctness of data. Specifically, when the memory management circuit 502 receives the write command from the host system 11, the error checking and correcting circuit 508 generates an error correcting code (ECC) and/or an error detecting code (EDC) for data corresponding to the write command, and the memory management circuit 502 writes the data corresponding to the write command and the corresponding error correcting code and/or error detecting code to the rewritable non-volatile memory module 406. Afterwards, when reading the data from the rewritable non-volatile memory module 406, the memory management circuit 502 simultaneously reads the error correcting code and/or the error detecting code corresponding to the data, and the error checking and correcting circuit 508 performs the error checking and correcting operation on the read data according to the error correcting code and/or the error detecting code.

The buffer memory 510 is coupled to the memory management circuit 502 and is configured to temporarily store data and commands from the host system 11 or data from the rewritable non-volatile memory module 406. The power management circuit 512 is coupled to the memory management circuit 502 and is configured to control a power of the memory storage device 10.

Figure 6:
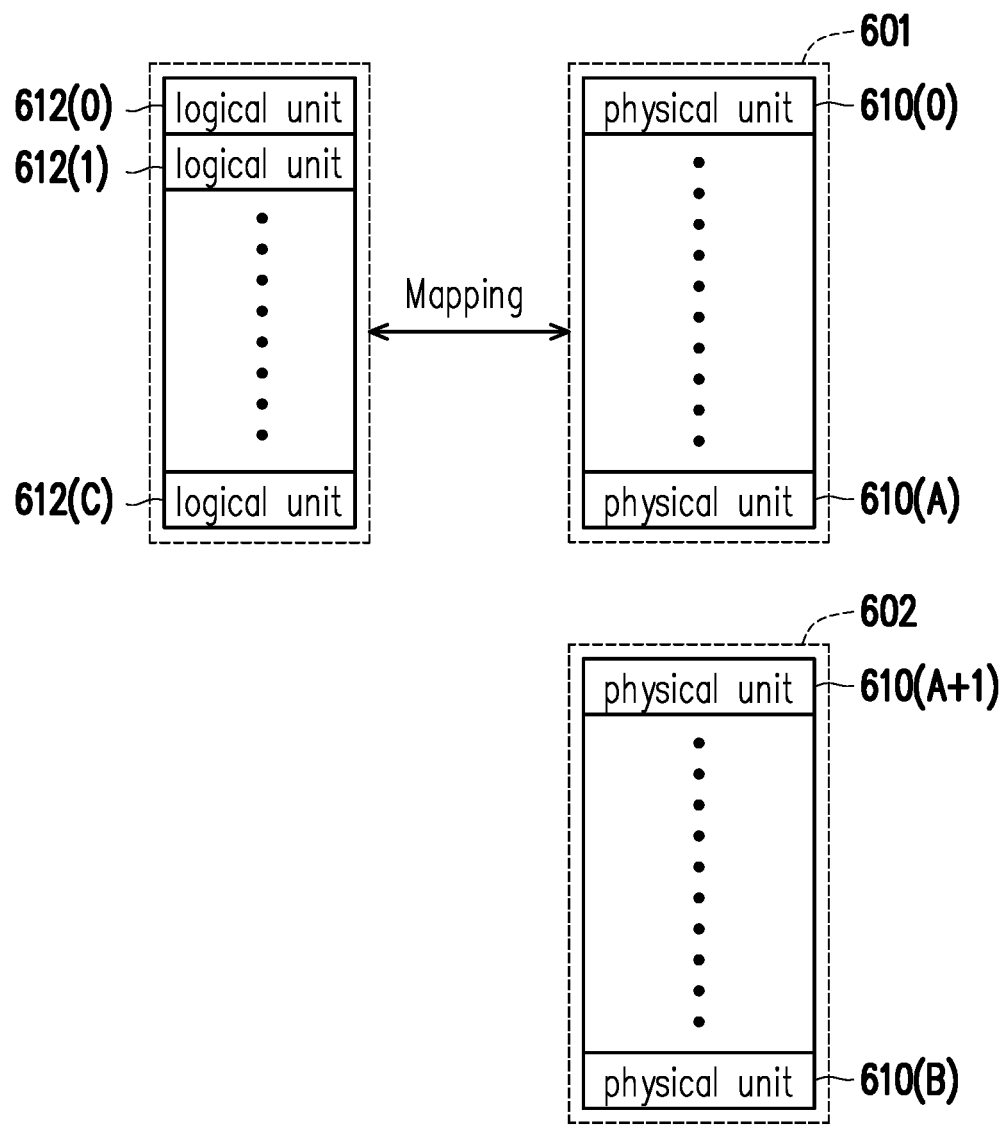
FIG. 6 is a schematic diagram illustrating management of a rewritable non-volatile memory module according to an exemplary embodiment of the disclosure.

FIG. 6 is a schematic diagram illustrating management of a rewritable non-volatile memory module according to an exemplary embodiment of the disclosure.

Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from a physical unit contains excessive errors and these errors cannot be corrected, the physical unit is regarded as a damaged physical unit. It is noted that if no physical erasing unit is available in the replacement area 602, the memory management circuit 502 may declare the entire memory storage device 10 as in a write protect state, and data can no longer be written.

In the present exemplary embodiment, each physical unit refers to a physical erasing unit. However, in another exemplary embodiment, a physical unit may refer to a physical address or a physical programming unit, or may consist of a plurality of consecutive or non-consecutive physical addresses. The memory management circuit 502 allocates logical units 612(0) to 612(C) to map to the physical units 610(0) to 610(A) in the storage area 601. In the present exemplary embodiment, each logical unit refers to a logical address. However, in another exemplary embodiment, a logical unit may refer to a logical programming unit or a logical erasing unit, or may consist of a plurality of consecutive or non-consecutive logical addresses. Moreover, each of the logical units 612(0) to 612(C) may also be mapped to one or more physical units.

The memory management circuit 502 records a mapping relation between the logical units and the physical units (also referred to as a logical-physical address mapping relation) in at least one logical-physical address mapping table. When the host system 11 is to read data from the memory storage device 10 or write data to the memory storage device 10, the memory management circuit 502 may perform an access operation on the data in the memory storage device 10 according to the logical-physical address mapping table.

It is noted that in the following description, some terms may be replaced with corresponding abbreviations for ease of reading (see Table 1).

TABLE 1

| rewritable non-volatile memory module | RNVM module |
|---|---|
| memory management circuit | MMC |
| read voltage level | RVL |
| read command sequence | RCS |

In the exemplary embodiment below, the RNVM module 406 is described as a TLC NAND flash memory module as an example. However, in another exemplary embodiment, identical or similar operations may also be applied to MLC NAND flash memory modules or flash memory modules of other types.

In an exemplary embodiment, before specific data (also referred to as original data) is stored to one or more physical units (also referred to as first physical units) in the RNVM module 406, the MMC 502 performs a randomization operation on the original data to randomize the original data into other data (also referred to as first data). For example, after the randomization operation, numbers of bits "0" and "1" among the original data may become consistent (namely, becoming equal or close to each other).

In an exemplary embodiment, the MMC 502 sends a write command sequence to the RNVM module 406 to instruct the RNVM module 406 to program the randomized original data (i.e., the first data) into a plurality of memory cells (also referred to as first memory cells) in the first physical unit. Thereby, the programmed first memory cells may be evenly programmed as storing bits "111", "110", "100", "101", "001", "000", "010", and "011".

It is noted that, in an exemplary embodiment, the original data comes from the host system 11 and contains data to be stored to the memory storage device 10. Therefore, the original data may be randomized and then stored. In an exemplary embodiment, a bit number (i.e., number of bits) of the original data is identical to a bit number (i.e., number of bits) of the first data. However, in another exemplary embodiment, the original data may be regarded as a seed for generating the first data, and it is possible that the original data does not come from the host system 11. Therefore, the bit number of the original data may be different from the bit number of the first data.

Figure 7:
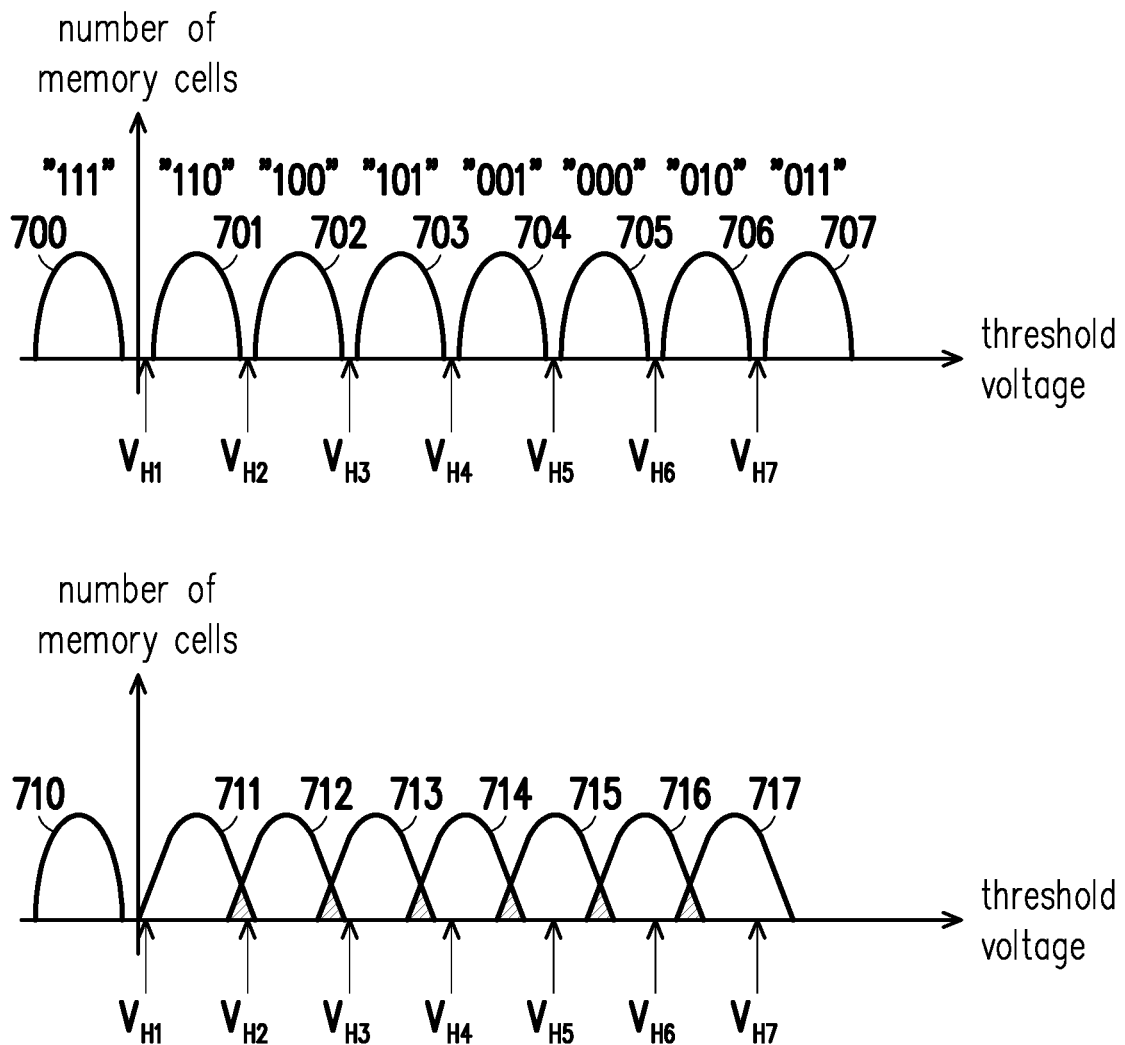
FIG. 7 is a schematic diagram illustrating a threshold voltage distribution of memory cells according to an exemplary embodiment of the disclosure.

FIG. 7 is a schematic diagram illustrating a threshold voltage distribution of memory cells according to an exemplary embodiment of the disclosure. FIG. 7 illustrates a threshold voltage distribution of the programmed first memory cells after the first memory cells in the RNVM module 406 are programmed according to the first data, wherein the horizontal axis represents a threshold voltage of the memory cells, and the vertical axis represents a number of the memory cells.

Referring to FIG. 7, in the present exemplary embodiment, the programmed first memory cells have 8 states 700 to 707. Memory cells belonging to the state 700 are configured to store the bit "111". Memory cells belonging to the state 701 are configured to store the bit "110". Memory cells belonging to the state 702 are configured to store the bit "100". Memory cells belonging to the state 703 are configured to store the bit "101". Memory cells belonging to the state 704 are configured to store the bit "001". Memory cells belonging to the state 705 are configured to store the bit "000". Memory cells belonging to the state 706 are configured to store the bit "010". Memory cells belonging to the state 707 are configured to store the bit "011". In other words, the states 700 to 707 respectively correspond to the default bit values "111", "110", "100", "101", "001", "000", "010", and "011". However, in another exemplary embodiment, the number of the states 700 to 707 may be adjusted, and the default bit value corresponding to each of the states may also be adjusted.

It is noted that, in an exemplary embodiment, the first memory cells are evenly distributed to the states 700 to 707. In other words, if a total number of the first memory cells is N, and a total number of the states 700 to 707 is M (i.e., 8), then a total number of the memory cells belonging to any one of the states 700 to 707 is N/M (i.e., N/8).

When data is to be read, RVLs $V_{H1}$ to $V_{H7}$ may be applied to the first memory cells to read data stored in at least part of the first memory cells. In other words, by sequentially applying the RVLs $V_{H1}$ to $V_{H7}$ to the first memory cells, one specific memory cell among the first memory cells may be determined as belonging to one of the states 700 to 707 to thereby obtain the data stored in this specific memory cell. For example, after the RVLs $V_{H1}$ to $V_{H7}$ are sequentially applied to the first memory cells, if one specific memory cell can be conducted by the RVL $V_{H5}$ but cannot be conducted by the RVL $V_{H4}$, it means that the threshold voltage of this specific memory cell is between the RVLs $V_{H4}$ and $V_{H5}$. Therefore, it can be determined that this specific memory cell belongs to the state 704 and is configured to store the bit "001".

However, as the time of use of the first memory cells extends and/or the operation environment changes, the first memory cells may undergo performance degradation. After performance degradation occurs, the states 700 to 707 may gradually become close to each other or even overlap each other. Moreover, the states 700 to 707 may also become more flat. For example, states 710 to 717 are used to represent a threshold voltage distribution of the first memory cells after performance degradation occurs.

After performance degradation occurs, the RVLs $V_{H1}$ to $V_{H7}$ are significantly shifted from the states 710 to 717 (or the states 710 to 717 are significantly shifted from the RVLs $V_{H1}$ to $V_{H7}$), as shown in FIG. 7. If the uncorrected RVLs $V_{H1}$ to $V_{H7}$ continue to be used to read the first memory cells, the states of many memory cells will be erroneously determined, which will result in presence of many errors in the data read from the first memory cells. If too many errors are present in the read data, the data may not be successfully decoded and outputted.

Moreover, since the number of the states of the first memory cells is large, the states are close to each other and each of the states occupies a narrow voltage range, which further contributes to correction difficulty of the RVLs. In some cases, it is even possible that, after correction is performed on the RVLs, the corrected RVLs are brought further away from the correct voltage positions. Taking the RVL $V_{H6}$ in FIG. 7 as an example, after performance degradation occurs in the memory cells, the RVL $V_{H6}$ is shifted from a voltage position between the states 705 and 706 to become closer to the state 717. Therefore, if a common read voltage correction mechanism is adopted, it is likely that the RVL $V_{H6}$ is erroneously corrected to a voltage position between the states 716 and 717, which brings the corrected RVL $V_{H6}$ further away from the correct voltage position (i.e., the voltage position between the states 715 and 716).

In an exemplary embodiment, after the first data is programmed into the first memory cells, the MMC 502 sends a RCS (also referred to as a first single-stage RCS) to the RNVM module 406 to instruct the RNVM module 406 to read the first memory cells by using a specific RVL (also referred to as a first RVL). According to a read result corresponding to the first single-stage RCS, the MMC 502 obtains count information (also referred to as first count information) corresponding to the first RVL. According to the first count information and default count information corresponding to the first RVL, the MMC 502 adjusts the first RVL.

In an exemplary embodiment, the first count information corresponding to the first RVL reflects a number of at least one memory cell each having a voltage level that is not greater than the first RVL among the programmed first memory cells. Alternatively, from another perspective, the first count information corresponding to the first RVL reflects a number of at least one memory cell that can be conducted by the first RVL among the programmed first memory cells.

Figures 8, 9:
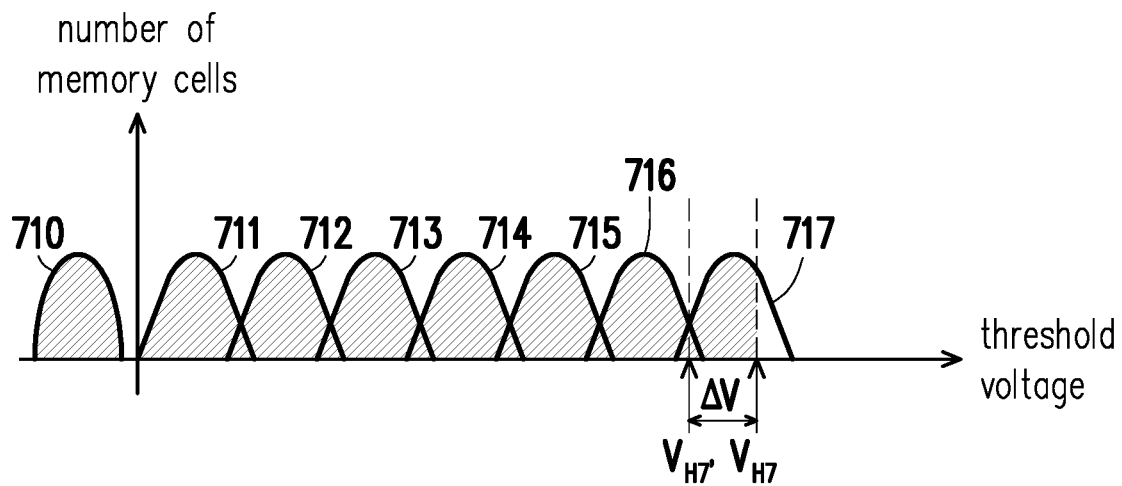
FIG. 8 is a schematic diagram illustrating correction of a first read voltage level according to an exemplary embodiment of the disclosure.
FIG. 9 is a schematic diagram illustrating index values of read voltage levels and corresponding default count information according to an exemplary embodiment of the disclosure.

FIG. 8 is a schematic diagram illustrating correction of the first RVL according to an exemplary embodiment of the disclosure. Referring to FIG. 8, assuming that the first RVL is the RVL $V_{H7}$, then after the first single-stage RCS which indicates to read the first memory cells by using the RVL $V_{H7}$ is sent, the first count information corresponding to the RVL $V_{H7}$ may be obtained according to the read result corresponding to the first single-stage RCS. For example, the first count information corresponding to the RVL $V_{H7}$ may reflect a number of at least one memory cell each having a voltage level that is not greater than the RVL $V_{H7}$ among the programmed first memory cells. Taking FIG. 8 as an example, the first count information corresponding to the RVL $V_{H7}$ may reflect a total number of the memory cells covered in the region marked in slant lines. For example, assuming that 1,000 memory cells may be conducted by the RVL $V_{H7}$, then the first count information, i.e., 1,000, corresponding to the RVL $V_{H7}$ may be obtained.

In an exemplary embodiment, the default count information corresponding to the first RVL reflects a default memory cell count corresponding to the first RVL. In an exemplary embodiment, a value of the default count information corresponding to the first RVL is positively correlated with the total number of the first memory cells, and the value of the default count information corresponding to the first RVL is negatively correlated with the total number of the states of the first memory cells.

FIG. 9 is a schematic diagram illustrating index values of the RVLs and the corresponding default count information according to an exemplary embodiment of the disclosure. Referring to FIG. 7 and FIG. 9, table information 901 records the default count information corresponding to the RVLs $V_{H1}$ to $V_{H7}$, which respectively assigned with index values of 1 to 7. Specifically, N is the total number of the first memory cells, and M of the total number (i.e., 8) of the states 700 to 707 (or the states 710 to 717). For example, assuming that the first RVL is the RVL $V_{H7}$, then the default count information corresponding to the RVL $V_{H7}$ may be 7×(N/8).

In an exemplary embodiment, the MMC 502 may obtain the default count information corresponding to the first RVL according to Equation (1) below:

$$C = i \times (N/M) \qquad (1)$$

In Equation (1), parameter C represents the default count information corresponding to the first RVL, parameter i represents the index value corresponding to the first RVL, parameter N represents the total number of the first memory cells, and parameter M represents the total number of the states of the first memory cells. Moreover, the MMC 502 may also establish the table information 901 according to Equation (1).

In an exemplary embodiment, a difference value between the first count information corresponding to the first RVL and the default count information corresponding to the first RVL reflects a degree of offset of the threshold voltage distribution of the first memory cells with respect to the first RVL. Namely, a greater difference value means a greater degree of offset of the threshold voltage distribution of the first memory cells. Conversely, a smaller difference value means a smaller degree of offset of the threshold voltage distribution of the first memory cells. Moreover, a sign (i.e., being positive or negative) of the difference value reflects whether the voltage value of the first RVL needs to be increased or decreased when the first RVL is corrected.

In an exemplary embodiment, the MMC 502 may determine an adjustment value (also referred to as a first adjustment value) according to the first count information corresponding to the first RVL and the default count information corresponding to the first RVL. The first adjustment value reflects the difference value between the first count information corresponding to the first RVL and the default count information corresponding to the first RVL. For example, the first adjustment value may be positively correlated with the difference value. Namely, as the difference value increases, the first adjustment value may also increase.

Taking FIG. 8 as an example, according to the first count information corresponding to the RVL $V_{H7}$ and the default count information corresponding to the RVL $V_{H7}$, the first adjustment value $\Delta V$ may be obtained. For example, the MMC 502 may obtain the first adjustment value $\Delta V$ according to the difference value between the first count information corresponding to the RVL $V_{H7}$ and the default count information corresponding to the RVL $V_{H7}$. For example, the MMC 502 may multiply the difference value by a voltage adjustment parameter to obtain the first adjustment value $\Delta V$. The MMC 502 may adjust the RVL $V_{H7}$ according to the first adjustment value $\Delta V$. For example, in the case where the first count information (e.g., 1,000) corresponding to the RVL $V_{H7}$ is greater than the default count information (e.g., 900) corresponding to the RVL $V_{H7}$, the MMC 502 may subtract the first adjustment value $\Delta V$ from the voltage value of the RVL $V_{H7}$ to obtain a new RVL $V_{H7'}$. Compared to the RVL $V_{H7}$, the new RVL $V_{H7'}$ is closer to the voltage position between the states 716 and 717. Therefore, compared to using the RVL $V_{H7}$, reading data from the first memory cells by using the new RVL $V_{H7'}$ effectively reduces the number of erroneous bits in the data.

In an exemplary embodiment, after the first adjustment value is obtained, the MMC 502 may further send at least one RCS (also referred to as a second single-stage RCS) to the RNVM module 406 according to the first adjustment value to instruct the RNVM module 406 to read the first memory cells by using a plurality of RVLs (also referred to as second RVLs). According to a read result corresponding to the second single-stage RCS, the MMC 502 may determine another adjustment value (also referred to as a second adjustment value). The MMC 502 may adjust the first RVL according to the first adjustment value and the second adjustment value.

Figure 10:
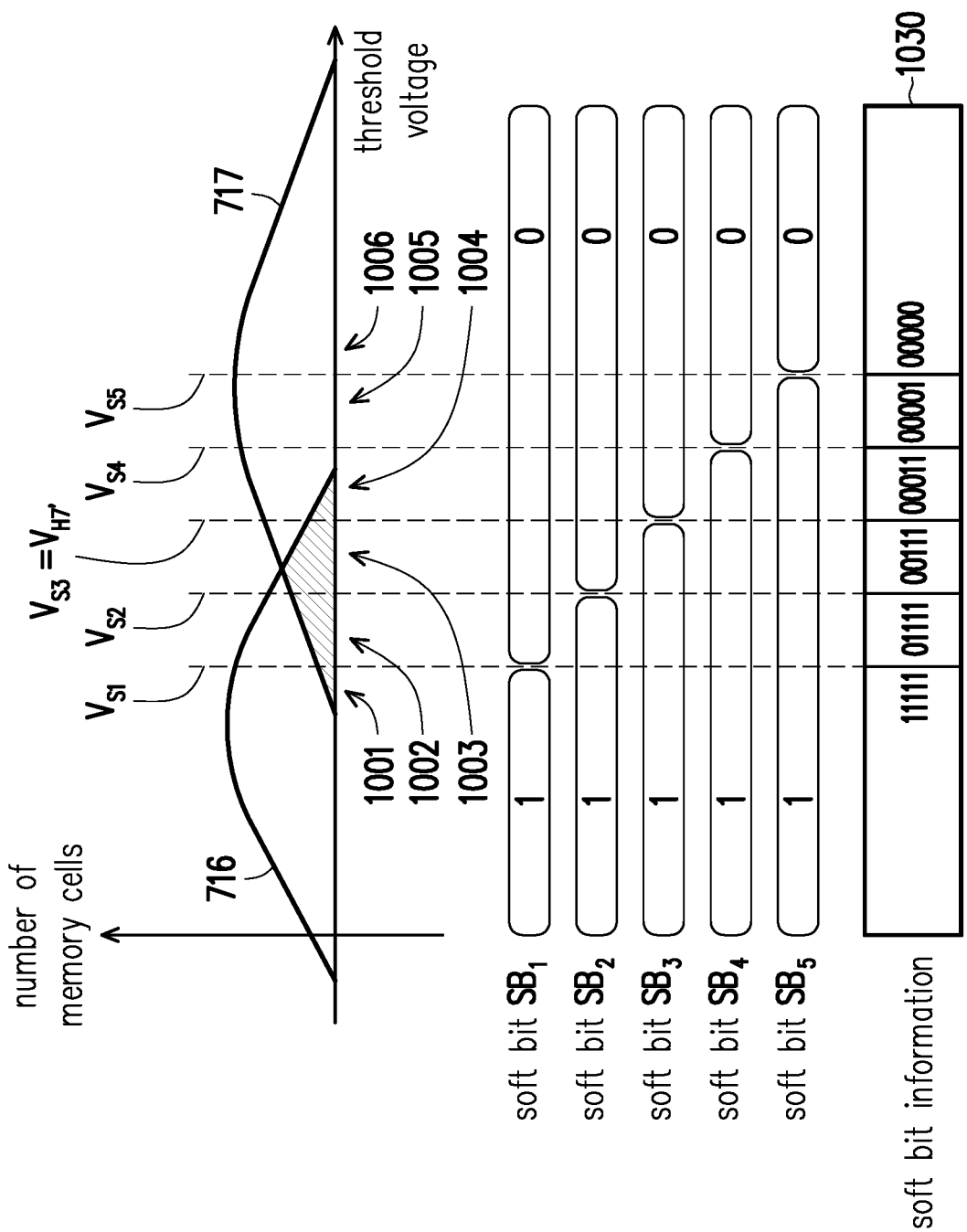
FIG. 10 is a schematic diagram illustrating reading of first memory cells by using a plurality of second read voltage levels according to an exemplary embodiment of the disclosure.

FIG. 10 is a schematic diagram illustrating reading of the first memory cells by using a plurality of second RVLs according to an exemplary embodiment of the disclosure. Referring to FIG. 10, in an exemplary embodiment, according to the second single-stage RCS, a plurality of RVLs $V_{S1}$ to $V_{S5}$ may be used to read the first memory cells, and the RVLs $V_{S1}$ to $V_{S5}$ may be determined according to the RVL $V_{H7}$ and the first adjustment value $\Delta V$ (or the RVL $V_{H7'}$). According to a read result of the RVLs $V_{S1}$ to $V_{S5}$, soft bit information 1030 containing soft bits $SB_1$ to $SB_5$ may be obtained. According to the soft bit information 1030, the numbers of memory cells having voltage levels respectively belonging to voltage ranges 1001 to 1006 may be obtained. According to the obtained numbers, a second adjustment value may be further determined and used to adjust the first RVL. For example, after calculation, if it is determined that the number of the memory cells each having a voltage level belonging to the voltage range 1003 is the smallest, then a second adjustment value may be generated and used to further adjust the RVL $V_{H7'}$ to be equal or close to the central position of the voltage range 1003.

From another perspective, the RVL adjustment operation in the exemplary embodiment of FIG. 8 may be regarded as a coarse-tuning operation of the RVL, and the RVL adjustment operation in the exemplary embodiment of FIG. 10 may be regarded as a fine-tuning operation of the RVL. In the exemplary embodiment of FIG. 8, the first adjustment value may be determined first. According to the first adjustment value, the voltage values of the RVLs $V_{S1}$ to $V_{S5}$ may be roughly determined. For example, the voltage value of the RVL $V_{S3}$ in FIG. 10 may be equal or close to the new RVL $V_{H7'}$ of FIG. 8. Afterwards, according to the read result (i.e., the soft bit information 1030) of using the RVLs $V_{S1}$ to $V_{S5}$, the new RVL $V_{H7'}$ may be further adjusted to the voltage position (i.e., the V-shaped position) located in the voltage range 1003 according to the second adjustment value. Accordingly, compared to adjusting the first RVL by simply using the first adjustment value, the first RVL further adjusted by using the second adjustment value may be more accurately positioned between the states 716 and 717.

It is noted that, in the adjustment operation of the first RVL in an exemplary embodiment, it is possible that the coarse-tuning operation of the RVL of the exemplary embodiment of FIG. 8 is performed, and the fine-tuning operation of the RVL of the exemplary embodiment of FIG. 10 is not performed. However, in the adjustment operation of the first RVL in another exemplary embodiment, the coarse-tuning operation of the RVL of the exemplary embodiment of FIG. 8 and the fine-tuning operation of the RVL of the exemplary embodiment of FIG. 10 may be sequentially performed.

In an exemplary embodiment, the adjustment operation of the first RVL may be performed after a decoding operation performed on the data read from the first memory cells fails. Alternatively, in an exemplary embodiment, the adjustment operation of the first RVL may be performed after the memory storage device 10 is turned on or before the memory storage device 10 is turned off, or may be performed in the background when the memory storage device 10 is operated normally.

In an exemplary embodiment, the RVLs $V_{H1}$ to $V_{H7}$ of FIG. 7 may also be referred to as hard-decision RVLs, and the RVLs $V_{S1}$ to $V_{S5}$ of FIG. 10 may also be referred to as soft-decision RVLs. In a hard bit mode decoding operation, the RVLs $V_{H1}$ to $V_{H7}$ may be applied to the first memory cells to read a hard bit, which is configured to represent the bit value stored in a memory cell, from each memory cell. Afterwards, in the hard bit mode decoding operation, the hard bits may be decoded to attempt to correct errors. However, in a soft bit mode decoding operation, the RVLs $V_{S1}$ to $V_{S5}$ may be applied to the first memory cells to read soft bits from each memory cell to obtain the soft bit information 1030 as shown in FIG. 10. In the soft bit mode decoding operation, the soft bit information may be used to determine or update decoding information. For example, according to the soft bit information, reliability information, such as a log likelihood ratio (LLR), corresponding to each bit in the data to be decoded may be determined or updated.

Afterwards, the soft bit mode decoding operation on the data to be decoded may be performed according to the determined or updated reliability information. People of ordinary skill in the art shall be aware how to perform the corresponding decoding operations by using the hard bits and the soft bits, which shall not be repeatedly described here.

In an exemplary embodiment, the hard bit mode decoding operation is performed in a first read mode, and the soft bit mode decoding operation is performed in a second read mode. In the first read mode, the MMC 502 may send the first single-stage RCS to instruct the RNVM module 406 to read the plurality of programmed first memory cells by using the first RVL. Response information sent back by the RNVM module 406 in response to the first single-stage RCS contains the first count information for adjusting the first RVL. How to adjust the first RVL according to the first count information has been detailed above and shall not be repeatedly described here.

In the first read mode, the MMC 502 may further send a common RCS (also referred to as a first common RCS) to instruct the RNVM module 406 to read the first memory cells by using the adjusted first RVL. It is noted that the common RCS refers to a RCS configured to read the read data requested by the host system 11. Namely, response information sent back by the RNVM module 406 in response to the first common RCS is used to generate the read data requested by the host system 11. For example, when the MMC 502 receives a read command that comes from the host system 11 and indicates to read a specific physical unit containing the first memory cells, the MMC 502 may send a first common RCS in response to the read command. In an exemplary embodiment, the data (i.e., the hard bits) read according to the first common RCS may be decoded by the hard bit mode decoding operation to correct the errors in the data. After the integrity of the data is confirmed (e.g., the errors in the read data are corrected), the MMC 502 may send the read data requested by the host system 11 to the host system 11.

It is noted that the first single-stage RCS and the first common RCS may both be sent to the RNVM module 406 in the first read mode to indicate to read the same first memory cells, however, the command codes of the first single-stage RCS and the first common RCS are different, and the data read according to the first single-stage RCS and the first common RCS are also different.

In an exemplary embodiment, if the hard bit mode decoding operation fails (namely, the hard bit mode decoding operation does not completely correct the errors in the data), a second read mode may be entered. In the second read mode, the MMC 502 may send at least one common RCS (also referred to as a second common RCS) which indicates to read the plurality of first memory cells by using a plurality of RVLs (also referred to as third RVLs). It is noted that response information sent back by the RNVM module 406 in response to the second common RCS is also used to generate the read data requested by the host system 11, and a number (e.g., 5) of the third RVLs is greater than the number (e.g., 1) of the first RVL. For example, in the second read mode, the RNVM module 406 may read the first memory cells by using a plurality of soft-decision RVLs (i.e., the third RVLs, which are similar to the RVLs $V_{S1}$ to $V_{S5}$ of FIG. 10) to obtain the soft bit information used in the soft bit mode decoding operation. In the soft bit mode decoding operation, the soft bit information may be used to decode the data read from the first memory cells to correct the errors in the data. After the integrity of the data is confirmed (e.g., the errors in the read data are corrected), the MMC 502 may send the read data requested by the host system 11 to the host system 11.

In the foregoing exemplary embodiment, the first RVL is described as the RVL $V_{H7}$ in FIG. 7 as an example. However, in another exemplary embodiment, the first RVL may also be any one of the RVLs $V_{H1}$ to $V_{H6}$ in FIG. 7, and the disclosure is not limited hereto. For example, in an exemplary embodiment, assuming that the first RVL is the RVL $V_{H3}$ in FIG. 7, after the first memory cells are read by using the RVL $V_{H3}$ to obtain the first count information corresponding to the RVL $V_{H3}$, and the corresponding default count information is obtained according to the table information 901 of FIG. 9 (or Equation (1)), the RVL $V_{H3}$ may be adjusted according to the obtained first count information and the obtained default count information. Relevant operation details are not repeatedly described here.

Figure 11:
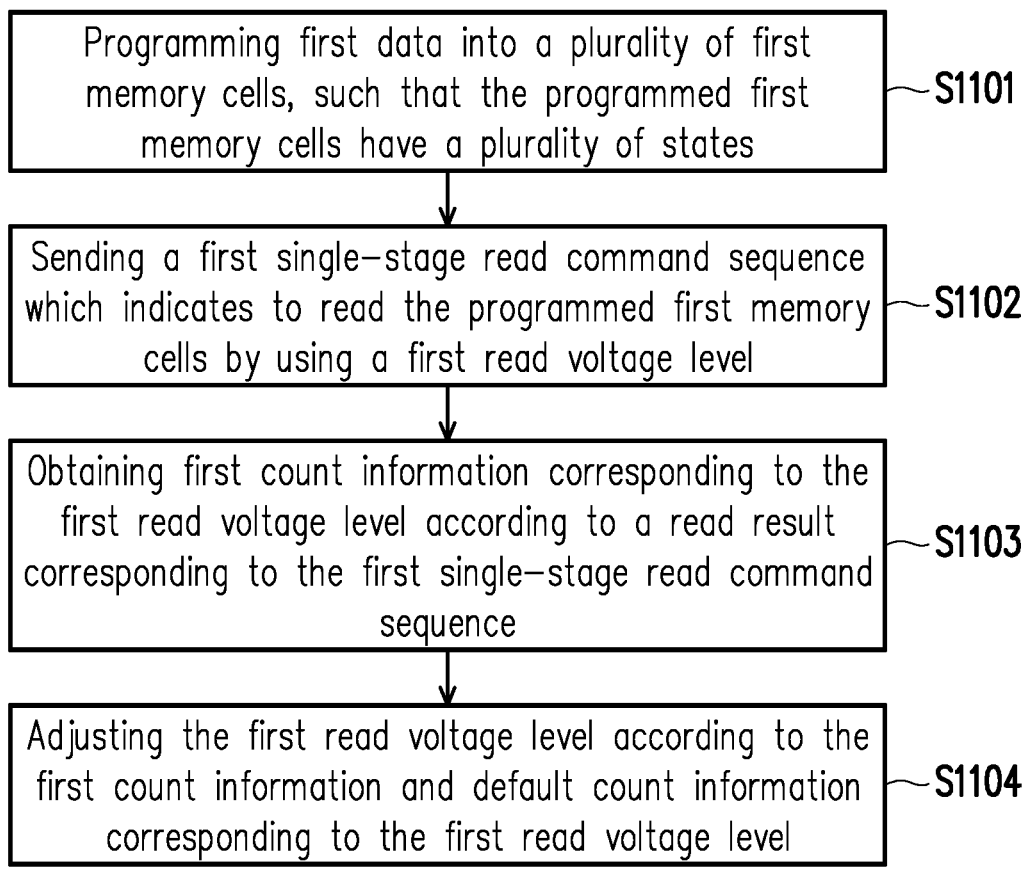
FIG. 11 is a flowchart illustrating a memory management method according to an exemplary embodiment of the disclosure.

FIG. 11 is a flowchart illustrating a memory management method according to an exemplary embodiment of the disclosure. Referring to FIG. 11, in step S1101, first data is programmed into a plurality of first memory cells, such that the programmed first memory cells have a plurality of states, and each of the plurality of states corresponds to default bit values. In step S1102, a first single-stage RCS which indicates to read the programmed first memory cells by using a first RVL is sent. In step S1103, first count information corresponding to the first RVL is obtained according to a read result corresponding to the first single-stage RCS. In step S1104, the first RVL is adjusted according to the first count information and default count information corresponding to the first RVL.

However, steps in FIG. 11 have been detailed above and will not be repeatedly described here. It is noted that the steps in FIG. 11 may be implemented as a plurality of program codes or circuits, which is not limited in the disclosure. Moreover, the method of FIG. 11 may be operated with the foregoing exemplary embodiments or may be operated on its own, which is not limited in the disclosure.

In summary of the above, after the first data is programmed into the first memory cells, the first memory cells have a plurality of states. After the first memory cells are read by using the first RVL, the first count information corresponding to the first RVL is obtained according to the read result corresponding to the first single-stage RCS. Then, the first RVL is automatically adjusted according to the first count information and the default count information corresponding to the first RVL. Moreover, in the operation of adjusting the first RVL, the coarse-tuning operation may be performed singly or the coarse-tuning operation may be performed with the fine-tuning operation. Accordingly, even if the threshold voltage distribution of the memory cells is significantly shifted, the RVL configured to read data from the memory cells can be effectively corrected, which further extends a lifespan of the memory storage device.

The previously described exemplary embodiments of the disclosure have the advantages aforementioned, wherein the advantages aforementioned are not required in all versions of the disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory management method for a memory storage device comprising a rewritable non-volatile memory module, wherein the rewritable non-volatile memory module comprises a plurality of memory cells, and the memory management method comprises:

randomizing original data to generate first data, wherein the original data is from a host system and comprises data to be stored;

programming the first data into a plurality of first memory cells among the memory cells, such that the programmed first memory cells have a plurality of states, wherein each of the plurality of states corresponds to a default bit value;

sending a first single-stage read command sequence which indicates to read the programmed first memory cells by using a first read voltage level;

obtaining first count information corresponding to the first read voltage level according to a read result corresponding to the first single-stage read command sequence;

sending a second single-stage read command sequence which indicates to read the programmed first memory cells by using a plurality of second read voltage levels according to the first count information, wherein a plurality of voltage ranges are classified by the second read voltage levels;

obtaining second count information reflecting a number of at least one memory cell each having a voltage level belonging to one of the voltage ranges according to a reading result corresponding to the second single-stage read command sequence; and adjusting the first read voltage level according to the first count information, the second count information and default count information corresponding to the first read voltage level.

2. The memory management method according to claim 1, wherein the default count information corresponding to the first read voltage level reflects a default memory cell count.

3. The memory management method according to claim 1, wherein a value of the default count information corresponding to the first read voltage level is positively correlated with a total number of the plurality of first memory cells, and the value of the default count information corresponding to the first read voltage level is negatively correlated with a total number of the plurality of states.

4. The memory management method according to claim 1, further comprising:

obtaining the default count information corresponding to the first read voltage level according to Equation (1) below:

$$C = i \times (N/M) \quad (1),$$

wherein in Equation (1), the parameter C represents the default count information corresponding to the first read voltage level, the parameter i represents an index value corresponding to the first read voltage level, the parameter N represents a total number of the plurality of first memory cells, and the parameter M represents a total number of the plurality of states.

5. The memory management method according to claim 1, wherein the first count information corresponding to the first read voltage level reflects a number of at least one memory cell each having a voltage level that is not greater than the first read voltage level among the programmed first memory cells.

6. The memory management method according to claim 1, wherein the step of adjusting the first read voltage level according to the first count information, the second count information and the default count information corresponding to the first read voltage level comprises:

determining a first adjustment value according to the first count information and the default count information; and adjusting the first read voltage level according to the first adjustment value and the second count information.

7. The memory management method according to claim 6, wherein the step of adjusting the first read voltage level according to the first adjustment value and the second count information comprises:

determining a second adjustment value according to the read result corresponding to the second single-stage read command sequence; and adjusting the first read voltage level according to the first adjustment value and the second adjustment value.

8. A memory storage device comprising:

a connection interface unit configured to couple to a host system;

a rewritable non-volatile memory module comprising a plurality of memory cells; and a memory control circuit unit coupled to the connection interface unit and the rewritable non-volatile memory module, wherein the memory control circuit unit is configured to randomize original data to generate first data, wherein the original data is from the host system and comprises data to be stored, wherein the memory control circuit unit is further configured to send a write command sequence which indicates to program the first data into a plurality of first memory cells among the memory cells, such that the programmed first memory cells have a plurality of states, wherein each of the plurality of states corresponds to a default bit value, wherein the memory control circuit unit is further configured to send a first single-stage read command sequence which indicates to read the programmed first memory cells by using a first read voltage level, wherein the memory control circuit unit is further configured to obtain first count information corresponding to the first read voltage level according to a read result corresponding to the first single-stage read command sequence, wherein the memory control circuit unit is further configured to send a second single-stage read command sequence which indicates to read the programmed first memory cells by using a plurality of second read voltage levels according to the first count information, wherein a plurality of voltage ranges are classified by the second read voltage levels, wherein the memory control circuit unit is further configured to obtain second count information reflecting a number of at least one memory cell each having a voltage level belonging to one of the voltage ranges according to a reading result corresponding to the second single-stage read command sequence, and wherein the memory control circuit unit is further configured to adjust the first read voltage level according to the first count information, the second count information and default count information corresponding to the first read voltage level.

9. The memory storage device according to claim 8, wherein the default count information corresponding to the first read voltage level reflects a default memory cell count.

10. The memory storage device according to claim 8, wherein a value of the default count information corresponding to the first read voltage level is positively correlated with a total number of the plurality of first memory cells, and the value of the default count information corresponding to the first read voltage level is negatively correlated with a total number of the plurality of states.

11. The memory storage device according to claim 8, wherein the memory control circuit unit is further configured to obtain the default count information corresponding to the first read voltage level according to Equation (1) below:

$$C=i \times (N/M) \qquad (1),$$

wherein in Equation (1), the parameter C represents the default count information corresponding to the first read voltage level, the parameter i represents an index value corresponding to the first read voltage level, the parameter N represents a total number of the plurality of first memory cells, and the parameter M represents a total number of the plurality of states.

12. The memory storage device according to claim 8, wherein the first count information corresponding to the first read voltage level reflects a number of at least one memory cell each having a voltage level that is not greater than the first read voltage level among the programmed first memory cells.

13. The memory storage device according to claim 8, wherein the operation of adjusting the first read voltage level according to the first count information, the second count information and the default count information corresponding to the first read voltage level by the memory control circuit unit comprises:
    determining a first adjustment value according to the first count information and the default count information; and
    adjusting the first read voltage level according to the first adjustment value and the second count information.

14. The memory storage device according to claim 13, wherein the operation of adjusting the first read voltage level according to the first adjustment value and the second count information by the memory control circuit unit comprises:
    determining a second adjustment value according to the read result corresponding to the second single-stage read command sequence; and
    adjusting the first read voltage level according to the first adjustment value and the second adjustment value.

15. A memory control circuit unit configured to control a rewritable non-volatile memory module comprising a plurality of memory cells, the memory control circuit unit comprising:
    a host interface configured to couple to a host system;
    a memory interface configured to couple to the rewritable non-volatile memory module; and
    a memory management circuit coupled to the host interface and the memory interface,
    wherein the memory management circuit is configured to randomize original data to generate first data, wherein the original data is from the host system and comprises data to be stored,
    wherein the memory management circuit is further configured to send a write command sequence which indicates to program the first data into a plurality of first memory cells among the memory cells, such that the programmed first memory cells have a plurality of states, wherein each of the plurality of states corresponds to a default bit value,
    wherein the memory management circuit is further configured to send a first single-stage read command sequence which indicates to read the programmed first memory cells by using a first read voltage level,
    wherein the memory management circuit is further configured to obtain first count information corresponding to the first read voltage level according to a read result corresponding to the first single-stage read command sequence,
    wherein the memory management circuit is further configured to send a second single-stage read command sequence which indicates to read the programmed first memory cells by using a plurality of second read voltage levels according to the first count information, wherein a plurality of voltage ranges are classified by the second read voltage levels,
    wherein the memory management circuit is further configured to obtain second count information reflecting a number of at least one memory cell each having a voltage level belonging to one of the voltage ranges according to a reading result corresponding to the second single-stage read command sequence, and
    wherein the memory management circuit is further configured to adjust the first read voltage level according to the first count information, the second count information and default count information corresponding to the first read voltage level.

16. The memory control circuit unit according to claim 15, wherein the default count information corresponding to the first read voltage level reflects a default memory cell count.

17. The memory control circuit unit according to claim 15, wherein a value of the default count information corresponding to the first read voltage level is positively correlated with a total number of the plurality of first memory cells, and the value of the default count information corresponding to the first read voltage level is negatively correlated with a total number of the plurality of states.

18. The memory control circuit unit according to claim 15, wherein the memory management circuit is further configured to obtain the default count information corresponding to the first read voltage level according to Equation (1) below:

$$C=i \times (N/M) \qquad (1),$$

wherein in Equation (1), the parameter C represents the default count information corresponding to the first read voltage level, the parameter i represents an index value corresponding to the first read voltage level, the parameter N represents a total number of the plurality of first memory cells, and the parameter M represents a total number of the plurality of states.

19. The memory control circuit unit according to claim 15, wherein the first count information corresponding to the first read voltage level reflects a number of at least one memory cell each having a voltage level that is not greater than the first read voltage level among the programmed first memory cells.

20. The memory control circuit unit according to claim 15, wherein the operation of adjusting the first read voltage level according to the first count information, the second count information and the default count info nation corresponding to the first read voltage level by the memory management circuit comprises:
    determining a first adjustment value according to the first count information and the default count information; and
    adjusting the first read voltage level according to the first adjustment value and the second count information.

21. The memory control circuit unit according to claim 20, wherein the operation of adjusting the first read voltage level according to the first adjustment value and the second count information by the memory management circuit comprises:
  determining a second adjustment value according to the read result corresponding to the second single-stage read command sequence; and
  adjusting the first read voltage level according to the first adjustment value and the second adjustment value.

22. A memory management method for a memory storage device comprising a rewritable non-volatile memory module, wherein the rewritable non-volatile memory module comprises a plurality of memory cells, and the memory management method comprises:
  in a first read mode, sending a first single-stage read command sequence which indicates to read a plurality of first memory cells being programmed based on first data that is generated by randomizing original data received from a host system among the plurality of memory cells by using a first read voltage level, wherein response information of the first single-stage read command sequence comprises first count information for adjusting the first read voltage level;
  in the first read mode, sending a second single-stage read command sequence which indicates to read the programmed first memory cells by using a plurality of second read voltage levels according to the first count information, wherein a plurality of voltage ranges are classified by the second read voltage levels and response information of the second single-stage read command sequence comprises second count information for further adjusting the first read voltage level; and
  in the first read mode, sending a first common read command sequence which indicates to read the plurality of first memory cells by using the adjusted first read voltage level, wherein response information of the first common read command sequence is used to generate read data requested by a host system.

23. The memory management method according to claim 22, further comprising:
  in a second read mode, sending at least one second common read command sequence which indicates to read the plurality of first memory cells by using a plurality of third read voltage levels, wherein response information of the at least one second common read command sequence is used to generate the read data requested by the host system, and a number of the plurality of third read voltage levels is greater than a number of the first read voltage level.

* * * * *